United States Patent [19]

Shepard, Jr.

[11] 4,162,928
[45] Jul. 31, 1979

[54] SOLAR CELL MODULE

[76] Inventor: Robert A. Frosch, Administrator of the National Aeronautics and Space Administration, with respect to an invention of Neal F. Shepard, Jr., King of Prussia, Pa.

[21] Appl. No.: 946,994

[22] Filed: Sep. 29, 1978

[51] Int. Cl.² ............................................... H01L 31/04
[52] U.S. Cl. ................................................ 136/89 PC
[58] Field of Search ..................................... 136/89 PC

[56] References Cited
U.S. PATENT DOCUMENTS

| 3,487,223 | 12/1969 | St. John | 250/216 |
| 3,973,994 | 8/1976 | Redfield | 136/89 |
| 4,116,718 | 9/1978 | Yerkes et al. | 136/89 PC |

Primary Examiner—Aaron Weisstuch
Attorney, Agent, or Firm—Monte F. Mott; John R. Manning; Paul F. McCaul

[57] ABSTRACT

An improved solar cell module for use in terrestrial environments, characterized by an internally reflective plate having a planar surface of incidence and an opposed textured surface, a plurality of uniformly spaced silicon solar cells having the active surfaces thereof bonded to portions of the textured surface, and a layer of diffusely reflective matter applied to the textured surface in surrounding relation with the solar cells for reflecting solar energy to strike the surface of incidence at such angles as to be internally re-reflected and caused to progress toward the active surfaces of the solar cells, whereby concentration of incident flux on the solar cell is achieved without increased module depth.

1 Claim, 3 Drawing Figures

SOLAR CELL MODULE

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

1. Field of the Invention

The invention generally relates to a solar cell module for terrestrial use and more particularly to a concentrator for a solar cell module adapted to employ repeated internal reflection for effectively concentrating solar energy onto the active surfaces of solar cells of the module.

2. Description of the Prior Art

Photovoltaic devices have long been employed for converting solar energy to electrical energy. To enhance the efficiency of such devices various schemes, techniques and devices have been proposed and employed for directing solar radiation to strike the active surfaces of semi-conductive devices, often referred to as solar cells. For example, U.S. Pat. No. 3,973,994 discloses a photovoltaic device having thin layers of active material backed by a transparent substrate. The side of the substrate opposite the active layer is formed in a sawtooth configuration and is reflectively coated so that unabsorbed radiation is reflected back to the active layer at an angle resulting in total internal reflection. Consequently, incident radiation is caused to pass through the solar cell for a finite number of times until it is absorbed by the active layer. The teachings of this patent are incorporated herein by reference thereto.

U.S. Pat. No. 2,888,007 discloses a screen having slots through which light is focused onto a photo-electric element. The surface of the screen disposed toward the element is covered by a reflective surface between the slots and repeatedly reflects solar radiation until substantially all of it has been absorbed by the element.

U.S. Pat. No. 2,001,672 discloses a light sensitive cell in which light passing through and not absorbed by an active layer thereof is reflected back to the layer by a reflecting surface.

U.S. Pat. Nos. 3,179,861 and 4,055,761 were discovered in the course of a search, however, the teachings thereof are not deemed to be more pertinent than the disclosures of the patents aforediscussed.

As can be appreciated by those familiar with the design and operation of solar cell modules, devices having a capability of concentrating solar flux on the active surface of a planar solar cell tend to be bulky, complex, and in many instances impractical when employed in an operational environment.

It is therefore the general purpose of the instant invention to provide in combination with a solar cell an improved concentrator having a capability of achieving significant concentration of incident solar flux for significantly enhancing short-circuit current for the cell, without resorting to a use of ancillary concentration devices which tend to increase module depth.

OBJECTS AND SUMMARY OF THE INVENTION

It is an object of the instant invention to provide an improved solar cell module.

It is another object to provide in combination with a planar silicon solar cell module a zero-depth concentrator.

It is another object to provide an improved solar cell module characterized by a transparent cover plate having a coated textured surface for establishing internal re-reflection of solar flux whereby solar energy is concentrated on the active surface of solar cells bonded to the textured surface.

These together with other objects and advantages are achieved through the use of an internally reflective transparent cover plate for a solar cell module, characterized by a planar surface of incidence and a diffusively reflective textured surface and having at least one silicon solar cell bonded at its active surface to a portion of the textured surface, whereby incident solar flux striking the surface of incidence is re-reflected internally of the cover plate until incident upon the active surface of the solar cell, as will hereinafter become more readily apparent by reference to the following description and claims in light of the accompanying drawings.

DESCRIPTION OF THE PREFERRED EMBODIMENT

Figure 1:
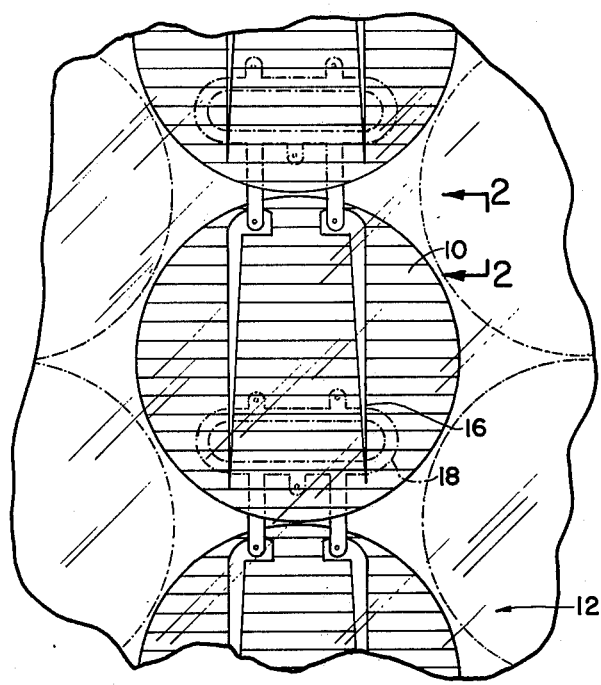
FIG. 1 is a fragmented, top plan view of a single solar cell affixed to the reflectively coated textured surface of a transparent cover plate comprising a zero-depth solar voltaic concentrator embodying the principles of the instant invention.

Referring now to the drawings with more particularity, wherein like reference characters designate like or corresponding parts throughout the several views, there is shown in FIG. 1 a fragment of a solar cell module which embodies the principles of the instant invention.

As shown, the module, not designated, includes a silicon solar cell 10 mounted on a flux concentrator 12. The details of the solar cell 10, of course, form no specific part of the instant invention, therefore, an in-depth description of the solar cell 10 is omitted in the interest of brevity. However, it is to be understood that the solar cell 10 comprises a photovoltaic device of well known design. The cell includes an active surface 14, FIG. 2, to which is attached contacts 16, FIG. 1, and a back surface to which is connected contacts 18. The contacts are affixed to the cell 10 in a conventional manner and, of course, serve to connect the cell 10 to adjacent cells provided for the module, all in a manner well understood by those familiar with the design and fabrication of solar cell modules. Hence, it is to be understood the cells 10 are of known design and are interconnected in a known manner for purposes of converting solar flux to electrical energy.

Figure 2:
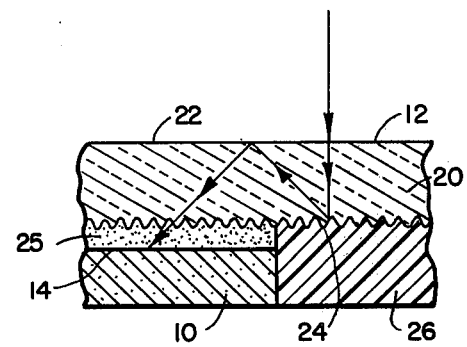
FIG. 2 is a fragmented, cross-sectional view taken generally along line 2—2 schematically illustrating a progression of solar flux to the active surface of the cell depicted in FIG. 2.

Turning again to FIG. 2, it can be seen that the concentrator 12 comprises a plate 20 formed of a highly transparent material. One such material is available as ASG Sunadex glass. The plate 20, as best illustrated in FIG. 2, includes a relatively flat and smooth surface 22, herein referred to as a surface of incidence for solar flux. That is to say, the surface 22 comprises the surface of the concentrator on which solar energy falls and through which solar energy is admitted to the concentrator.

The surface of the plate 20, opposite the surface of incidence 22, comprises a textured surface designated 24. The textured surface 24, in practice, is deliberately embossed to provide a regular pattern of uniform indentations. To this surface there is bonded a uniform array of solar cells 10. The cells are bonded to the plate 20 employing a film 25 of transparent adhesive, such as Saflex PT-10, for example. The surface 24 also is coated by a layer 26 of diffusely reflective material such as RTV 11. Hence, there is provided between the cells 10 a substantially white surface. The purpose of the white surface of the layer 26 is to establish internal reflection of solar energy within the plate 20 for thus causing the rays thereof to strike the surface of incidence 22 at angles of incidence greater than the critical angle therefor, whereby the solar energy is progressively reflected internally of the plate 20 until it is permitted to pass from the plate 20 to strike the active surface 14 of a solar cell 10.

The critical angle, of course, can readily be computed according to Snell's law, as more fully discussed in the aforementioned U.S. Pat. No. 3,973,994.

It suffices to understand that the solar flux reflected from the textured surface of the plate 20 is reflected back and forth between the textured surface 24 and the surface 22 until the rays of flux exit the plate 20 to strike the active surface 14 of the solar cell 10.

Figure 3:
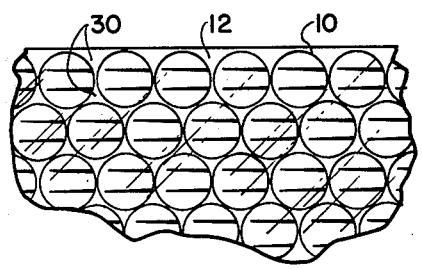
FIG. 3 is a fragmented, top plan view of a solar cell module employing the solar cell depicted in FIG. 1.

As shown in FIG. 3, the solar cells 10 are attached to the concentrator 12 with voids, or interspaces, designated 30, located between the individual cells 10 being backed by the reflective layers 26. Thus the layer 26 surrounds each of the cells 10. Consequently, the concentrator 12 serves to trap incident solar radiation which exits the concentrator, after repeated internal reflection to fall, on the active surface of the cell 10.

In view of the foregoing, it should be apparent that the concentrator 12 is particularly adapted to effectively concentrate otherwise wasted solar flux onto the active surface of solar ccells of the module for thus enhancing the electrical power output from the module, without resorting to the use of auxiliary concentration devices which tend to increase module depth.

Moreover, since solar cells constitute the bulk of the costs for terrestrial modules, it should be apparent that the overall cost per unit of electrical power output can be reduced through the use of the instant invention due to the fact that the cells are sparsely concentrated for thus making extensive use of less expensive glass, in lieu of heavy concentrations of silicon solar cells, to achieve a desired electrical output.

What is claimed is:

1. An improved solar cell module comprising:
   A. an internally reflective, transparent cover plate having a pair of opposed surfaces including a substantially smooth planar surface of incidence for accepting incident solar energy, and a uniformly textured surface characterized by a plurality of uniformly configured indentations;
   B. a plurality of silicon solar cells adhesively bonded at the active surfaces thereof to mutually spaced portions of said textured surface and defining therebetween interspaces; and
   C. means comprising a layer of diffusely reflective material deposited on said textured surface in the interspaces defined between said cells for internally reflecting solar energy to strike said surface of incidence at such angles as to be internally re-reflected, whereby the energy is caused to progress toward the active surfaces of the solar cells of said plurality.

* * * * *